US008836083B2

(12) United States Patent
Zhou

(10) Patent No.: US 8,836,083 B2
(45) Date of Patent: Sep. 16, 2014

(54) METHODS TO REDUCE THE CRITICAL DIMENSION OF SEMICONDUCTOR DEVICES AND RELATED SEMICONDUCTOR DEVICES

(75) Inventor: Baosuo Zhou, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 185 days.

(21) Appl. No.: 13/619,905

(22) Filed: Sep. 14, 2012

(65) Prior Publication Data

US 2013/0009283 A1  Jan. 10, 2013

Related U.S. Application Data

(62) Division of application No. 12/887,906, filed on Sep. 22, 2010, now Pat. No. 8,338,304, which is a division of application No. 11/606,613, filed on Nov. 29, 2006, now Pat. No. 7,807,575.

(51) Int. Cl.
*H01L 29/06* (2006.01)
*H01L 21/311* (2006.01)
*H01L 21/308* (2006.01)
*H01L 21/033* (2006.01)

(52) U.S. Cl.
CPC ........ *H01L 21/0338* (2013.01); *H01L 21/3088* (2013.01)
USPC .......................................... 257/618; 438/696

(58) Field of Classification Search
CPC ... H01L 29/06; H01L 21/311; H01L 21/3088; H01L 21/0338
USPC ............................ 257/618, E29.005, E21.249
See application file for complete search history.

(56) References Cited

U.S. PATENT DOCUMENTS

| | | | |
|---|---|---|---|
| 5,328,810 A | 7/1994 | Lowrey et al. | |
| 5,795,830 A | 8/1998 | Cronin et al. | |
| 6,063,688 A | 5/2000 | Doyle et al. | |
| 6,110,837 A | 8/2000 | Linliu et al. | |
| 6,239,008 B1 | 5/2001 | Yu et al. | |
| 6,362,057 B1 | 3/2002 | Taylor, Jr. et al. | |

(Continued)

FOREIGN PATENT DOCUMENTS

| | | |
|---|---|---|
| JP | 57048237 | 3/1982 |
| JP | 03270227 A | 12/1991 |

(Continued)

OTHER PUBLICATIONS

International Search Report dated Apr. 23, 2008, for International Application No. PCT/US2007/085371 (three pages).

(Continued)

*Primary Examiner* — Walter H Swanson
(74) *Attorney, Agent, or Firm* — TraskBritt

(57) ABSTRACT

A method of forming features on a target layer. The features have a critical dimension that is triple- or quadruple-reduced compared to the critical dimension of portions of a resist layer used as a mask. An intermediate layer is deposited over a target layer and the resist layer is formed over the intermediate layer. After patterning the resist layer, first spacers are formed on sidewalls of remaining portions of the resist layer, masking portions of the intermediate layer. Second spacers are formed on sidewalls of the portions of the intermediate layer. After removing the portions of the intermediate layer, the second spacers are used as a mask to form the features on the target layer. Integrated circuit devices are also disclosed.

21 Claims, 8 Drawing Sheets

(56) References Cited

U.S. PATENT DOCUMENTS

| | | |
|---|---|---|
| 6,605,541 B1 | 8/2003 | Yu |
| 6,638,441 B2 | 10/2003 | Chang et al. |
| 6,667,237 B1 | 12/2003 | Metzler |
| 6,734,107 B2 | 5/2004 | Lai et al. |
| 7,005,240 B2 | 2/2006 | Manger et al. |
| 7,393,789 B2 | 7/2008 | Abatchev et al. |
| 7,611,980 B2 | 11/2009 | Wells et al. |
| 7,807,575 B2 | 10/2010 | Zhou |
| 2003/0127426 A1 | 7/2003 | Chang |
| 2006/0046201 A1 | 3/2006 | Sandhu et al. |
| 2006/0046484 A1 | 3/2006 | Abatchev et al. |
| 2006/0263699 A1 | 11/2006 | Abatchev |
| 2006/0276032 A1 | 12/2006 | Arakawa et al. |
| 2007/0026684 A1 | 2/2007 | Parascandola et al. |
| 2007/0049040 A1 | 3/2007 | Bai et al. |
| 2008/0008969 A1 | 1/2008 | Zhou et al. |
| 2008/0261349 A1 | 10/2008 | Abatchev et al. |

FOREIGN PATENT DOCUMENTS

| | | |
|---|---|---|
| JP | 06021340 | 1/1994 |
| JP | 06077180 | 3/1994 |
| JP | 8-055908 | 2/1996 |
| JP | 8-055920 | 2/1996 |
| JP | 2001156283 A | 6/2001 |
| JP | 2002280388 | 9/2002 |
| JP | 2007043156 A | 2/2007 |
| KR | 10-2004-0025289 | 3/2004 |
| WO | 2006070474 A1 | 7/2006 |

OTHER PUBLICATIONS

International Written for International Application No. PCT/US2007/085371 mailed Apr. 23, 2008, 6 pages.

Singapore Search Report dated Nov. 2, 2009, for Singapore Application No. 200903378-8 (seven pages).

Japanese Office Action for Japanese Application No. 2009-539423 mailed Oct. 9, 2012, 6 pages.

METHODS TO REDUCE THE CRITICAL DIMENSION OF SEMICONDUCTOR DEVICES AND RELATED SEMICONDUCTOR DEVICES

CROSS-REFERENCE TO RELATED APPLICATIONS

This application is a divisional of U.S. patent application Ser. No. 12/887,906, filed Sep. 22, 2010, now U.S. Pat. No. 8,338,304, issued Dec. 25, 2012, which is a divisional of U.S. patent application Ser. No. 11/606,613, filed Nov. 29, 2006, now U.S. Pat. No. 7,807,575, issued Oct. 5, 2010, the disclosure of which is hereby incorporated herein by this reference in its entirety.

BACKGROUND OF THE INVENTION

Field of the Invention

Embodiments of the present invention relate generally to the fabrication of semiconductor devices and, more specifically, to methods for reducing the critical dimension (CD) of semiconductor devices and to partially fabricated semiconductor devices having reduced critical dimensions.

Integrated circuit ("IC") designers desire to increase the level of integration, or density, of features within an IC by reducing the size of the individual features and by reducing the separation distance between neighboring features on a semiconductor substrate. The continual reduction in feature sizes places ever-greater demands on techniques used to form the features, such as photolithography. These features are typically defined by openings in, and spaced from each other by, a material, such as an insulator or conductor. The distance between identical points in neighboring features is referred to in the industry as "pitch." For instance, the pitch is typically measured as the center-to-center distance between the features. As a result, pitch is about equal to the sum of the width of a feature and of the width of the space separating that feature from a neighboring feature. The width of the feature is also referred to as the CD or minimum feature size ("F") of the line. The CD is typically the smallest geometrical feature, such as the width of an interconnect line, contact, or trench, that is formed during IC manufacturing using a given technology, such as photolithography. Because the width of the space adjacent to the feature is typically equal to the width of the feature, the pitch of the feature is typically two times the feature size (2F).

Conventional 248 nm photolithography enables a minimum line width of from 100 nm to 200 nm to be formed. However, with the pressure to reduce feature sizes and pitch, pitch-doubling techniques have been developed. U.S. Pat. No. 5,328,810 discloses a method of pitch doubling using spacers or mandrels to form evenly spaced trenches in a semiconductor substrate. The trenches have equal depths. An expendable layer is formed on the semiconductor substrate and patterned, forming strips having a width of F. The strips are etched, producing mandrel strips having a reduced width of F/2. A partially expendable stringer layer is conformally deposited over the mandrel strips and etched to form stringer strips having a thickness of F/2 on sidewalls of the mandrel strips. The mandrel strips are etched while the stringer strips remain on the semiconductor substrate. The stringer strips function as a mask to etch trenches having a width of F/2 in the semiconductor substrate. While the pitch in the above-mentioned patent is actually halved, such a reduction in pitch is referred to in the industry as "pitch doubling" or "pitch multiplication." In other words, "multiplication" of pitch by a certain factor involves reducing the pitch by that factor. This conventional terminology is retained herein.

U.S. Pat. No. 6,239,008 discloses a method of pitch doubling. A photoresist is patterned over a semiconductor material layer. The dimension of one photoresist structure and one adjoining space is defined as x. The photoresist structures are trimmed to ½x. The spaces between structures are increased to ¾x. The exposed portions of the semiconductor material layer are etched forming structures in the semiconductor material layer. The photoresist structures are removed. A blanket layer is deposited over the semiconductor material layer structures. The blanket layer is etched to form spacers on the sidewalls of the semiconductor material layer structures. A second blanket layer is deposited over the semiconductor material layer structures, the spacers, and the spaces, forming a second set of structures in the spaces. The second blanket layer is a material similar to, or the same as, the material from which the semiconductor material layer structures are made. The semiconductor material layer structures, the spacers, and the second set of structures are planarized. The spacers are removed. The semiconductor material layer structures and the second set of structures and the spaces therebetween have a dimension of ¼x.

U.S. Pat. No. 6,638,441 discloses a method of pitch tripling. A photoresist layer is patterned on a substrate. A layer is formed over the pattern. The first layer is etched to expose the substrate. A second layer is formed over the pattern. The second layer is etched to expose the substrate. The patterned resist is removed. A third layer is formed over the first and second layers and the substrate. The third layer is etched to expose the substrate. A fourth layer is formed over the first, second, and third layers and the substrate. The material of the fourth layer is the same as the material of the first layer. The fourth layer is etched to expose the first, second, and third layers. The second and third layers are removed. The first and fourth layers form a pattern with a pitch that has been tripled.

193 nm photolithography is able to form smaller features than 248 nm photolithography. However, 193 nm photoresist materials have increased line edge roughness (LER) compared to 248 nm photoresist materials. In addition, 248 nm photoresist materials are stronger than 193 nm photoresist materials.

Therefore, a need exists in the art for a pitch reduction process able to reduce the CD of a feature utilizing a 248 nm photoresist.

BRIEF DESCRIPTION OF THE SEVERAL VIEWS OF THE DRAWINGS

While the specification concludes with claims particularly pointing out and distinctly claiming that which is regarded as the present invention, the embodiments of this invention can be more readily ascertained from the following description of the invention when read in conjunction with the accompanying drawings in which:

DETAILED DESCRIPTION OF THE INVENTION

Embodiments of the present invention generally relate to fabricating semiconductor devices. More particularly, embodiments of the present invention relate to methods of reducing the CD of a feature and partially fabricated integrated circuit devices with such reductions.

In one embodiment, a method of reducing the CD of a semiconductor device feature includes forming a target layer, also referred to as target material, the target layer to have features with a reduced CD. An intermediate layer, also referred to as intermediate material, is formed over the target layer. A pattern is formed in a resist layer overlying the intermediate layer, the pattern having a CD that is printable by conventional lithographic techniques. The CD of the pattern may be determined by the size of the features ultimately to be formed in the target layer. First spacer material vertical regions (first spacers) are formed adjacent to remaining portions of the resist layer. The target layer is exposed between the first spacers and intermediate layer vertical regions are formed by remaining portions of the intermediate layer. Second spacer material vertical regions (second spacers) are formed next to the intermediate layer vertical regions. Intermediate layer vertical regions are removed. The CD of the features formed on the target layer is a function of the thickness of the first spacers and the second spacers.

The methods and partially fabricated integrated circuit devices described herein do not form a complete process flow for manufacturing integrated circuits. The remainder of the process flow is known to those of ordinary skill in the art. Accordingly, only the methods and partially fabricated integrated circuit devices necessary to understand embodiments of the present invention are described herein.

The material layers described herein may be formed by a suitable deposition technique including, but not limited to, spin-coating, blanket coating, chemical vapor deposition ("CVD"), atomic layer deposition ("ALD"), plasma enhanced ALD, or physical vapor deposition ("PVD"). Depending on the material to be used, the deposition technique may be selected by a person of ordinary skill in the art.

Reference will now be made to the drawings, where like numerals refer to like parts throughout. The drawings are not necessarily drawn to scale.

In one embodiment of the invention, features with a reduced CD and, as a result, a reduced pitch, may be formed on the target layer. The CD of the features may be a factor of three less than the CD of an initial pattern formed on an overlying layer, such as the resist layer. An embodiment of a triple pitch reduction method is illustrated in FIGS. 1-10.

Figure 1:
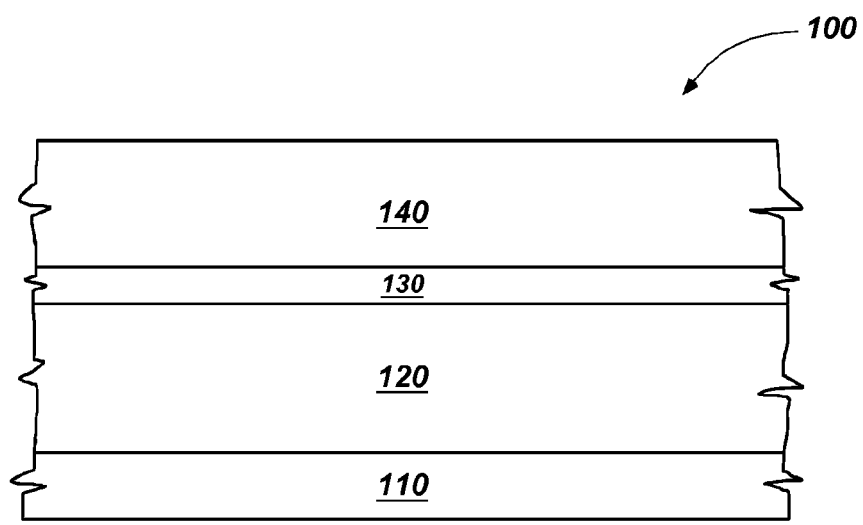
FIG. 1 illustrates an embodiment of an intermediate layer, an anti-reflective layer, and a resist layer formed over a target layer on a partially fabricated integrated circuit device.

As illustrated in FIG. 1, a partially fabricated integrated circuit device 100 may include a target layer 110. The features having the reduced CD may ultimately be formed in the target layer 110. The CD of the features may be reduced relative to the CD of a pattern formed in an overlying resist layer 140. Since the CD of the features is reduced, the pitch of the features is also reduced. The target layer 110 may be fanned from a material that is compatible with semiconductor device fabrication. For instance, the target layer 110 may be a semiconductor substrate, such as a conventional silicon substrate or other bulk substrate having a layer of semiconductive material. As used herein, the term "bulk substrate" includes not only silicon wafers, but also silicon-on-insulator ("SOI") substrates, silicon-on-sapphire ("SOS") substrates, epitaxial layers of silicon on a base semiconductor foundation, and other semiconductor, optoelectronics, or biotechnology materials, such as silicon-germanium, germanium, gallium arsenide, gallium nitride, or indium phosphide.

Intermediate layer 120 may be formed above the target layer 110. The intermediate layer 120 may function as a sacrificial mask when forming the features on the target layer 110. The thickness of the intermediate layer 120 may depend on a desired height of the sacrificial mask. The intermediate layer 120 may be formed from a material that is selectively etchable relative to spacers formed on the partially fabricated integrated circuit device 100. As used herein, a material is "selectively etchable" when the material exhibits an etch rate of at least about 2 times greater than that of another material exposed to the same etch chemistry. Ideally, such a material has an etch rate of at least about 10 times greater than that of another material exposed to the same etch chemistry. For the sake of example only, the intermediate layer 120 may be formed from transparent carbon (TC), amorphous carbon (AC), or a spin-on material. The intermediate layer 120 may be formed by conventional techniques, such as by CVD or by spin-coating.

An anti-reflective layer 130 may be formed above the intermediate layer 120. Anti-reflective materials are known in the art and may include, but are not limited to, inorganic materials, such as silicon dioxide or silicon oxynitride, which is a dielectric anti-reflective coating (DARC), or organic materials, such as a silicon-containing, spin-on hard mask. The anti-reflective layer 130 may be formed by conventional techniques.

Figure 2:
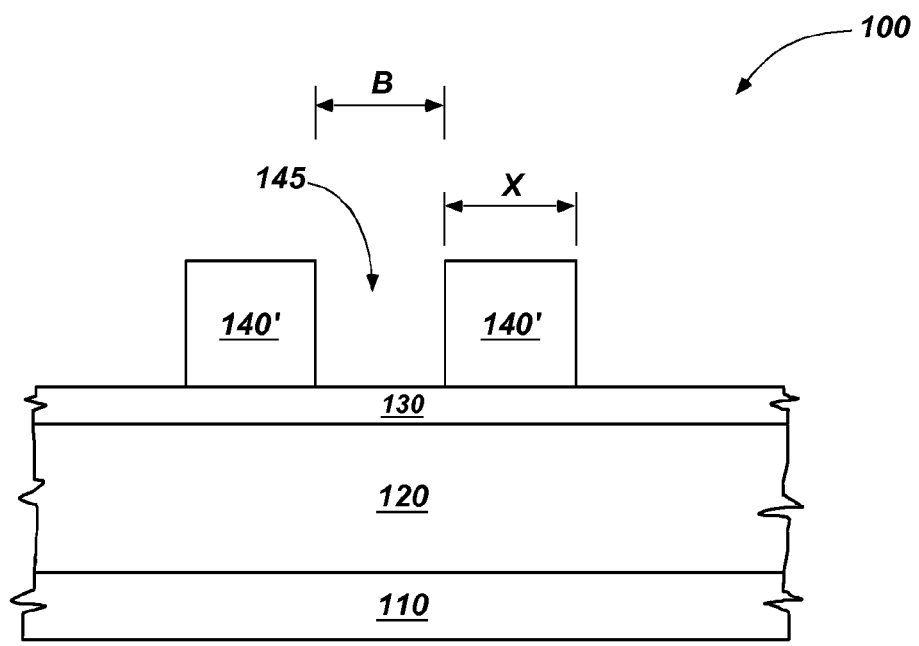
FIG. 2 illustrates an embodiment of the resist layer of FIG. 1 patterned with a desired CD.

A resist layer 140 may be formed on top of the anti-reflective layer 130. The resist layer 140 may be formed from a 248 nm photoresist material, such as a deep ultraviolet (DUV) 248 nm photoresist. The 248 nm photoresist materials are well known in the art and, therefore, are not described in detail herein. Other photoresist materials, such as a 193 nm photoresist, may be used to form the resist layer 140. Additional etching may be utilized to smooth sidewalls of the resist layer 140' prior to depositing first spacer layer 150. The photoresist material may be deposited by conventional techniques, such as by spin-coating, and patterned by conventional, photolithographic techniques. Photoresists and photolithographic techniques are well known in the art and, therefore, selecting, depositing, and patterning the photoresist material are not discussed in detail herein. As illustrated in FIG. 2, a pattern may be formed in the resist layer 140 by developing and etching the photoresist material. The remaining portions of the resist layer 140' may be separated by openings 145. The resist layer 140' may have the minimum printable CD achievable using the selected patterning or photolithography technique. Alternatively, the resist layer 140' may be subjected to additional etching or trimming to achieve the desired CD. The pattern in the resist layer 140 may be used in combination with the first and second spacers 150', 160' to form the features in the target layer 110. These features may include, but are not limited to, lines, trenches, or other components of electrical devices.

The portions of the resist layer 140' remaining after developing and etching the photoresist material are shown in FIG. 2. Sidewalls of the resist layer 140' may have a substantially vertical profile. Since 248 nm photoresist materials have a good LER, the sidewalls of the resist layer 140' may also be relatively smooth. As such, when the first spacers are formed on the sidewalls, as described below, the substantially vertical profile may be maintained. The resist layer 140' may have a width or CD of about x, where x is a dimension that is printable by conventional lithographic techniques. As such, x is a function of the photolithography technique used to pattern the resist layer 140. The space between adjacent portions of the resist layer 140', which is denoted on FIG. 2 as B, may have a width of about x. As described below, B may be wider or narrower than width x.

Figure 3:
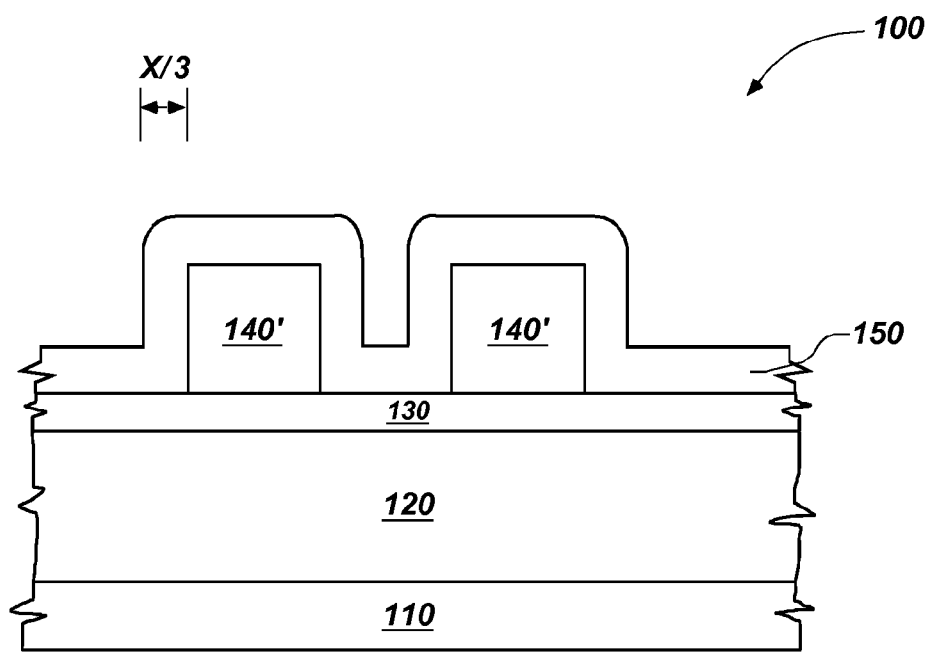
FIG. 3 illustrates an embodiment of a first spacer layer formed over the features of FIG. 2.

As illustrated in FIG. 3, a first spacer layer 150 may be formed on top of the anti-reflective layer 130 and on the sidewalls and top surface of the resist layer 140'. The first spacer layer 150 may be conformally deposited, such as by ALD. However, other deposition techniques may be used as long as the first spacer layer 150 is substantially conformally deposited at the desired thickness. The first spacer layer 150 may be foamed from a material that is compatible with subsequent fabrication acts and that is selectively etchable relative to the anti-reflective layer 130, the intermediate layer 120, and the target layer 110. For the sake of example only, the first spacer layer 150 may be formed from an oxide, such as a silicon oxide, or a nitride, such as silicon nitride. Since the photoresist material used is a 248 nm photoresist, the sidewalls of the resist layer 140' may exhibit a sufficiently low LER that the first spacer layer 150 may be applied directly to the resist layer 140'. However, additional etching may be used to smooth the sidewalls of the resist layer 140' before depositing the first spacer layer 150. The thickness of the first spacer layer 150 may be about equal to the CD of the features ultimately to be formed on the target layer 110. For example, if the features on the target layer 110 are to have a CD of about x/3, the first spacer layer 150 may be deposited at a thickness equal to about x/3.

Figure 4:
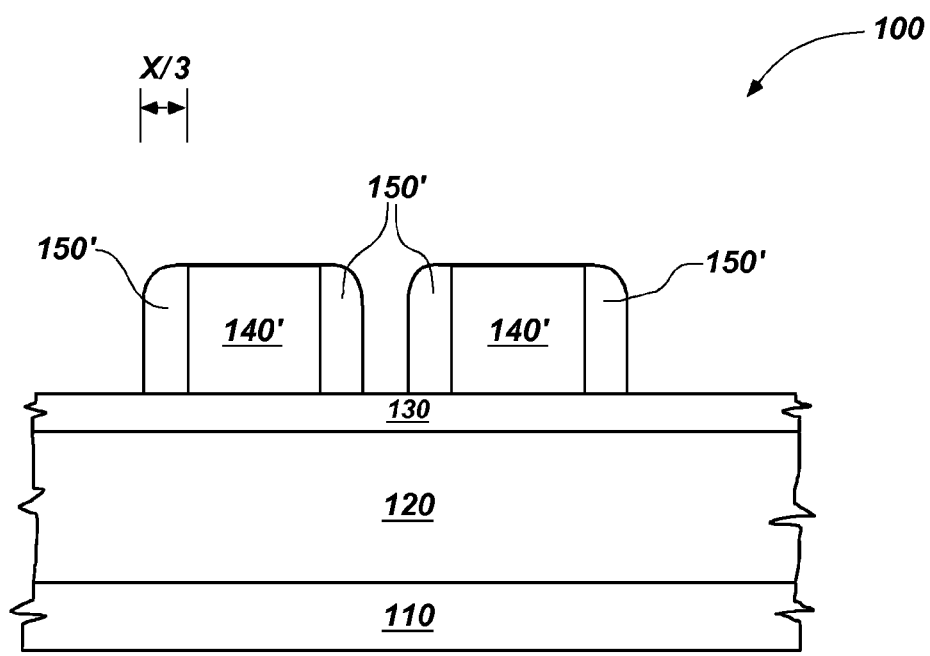
FIG. 4 illustrates an embodiment of first spacers formed from the first spacer layer of FIG. 3.

As illustrated in FIG. 4, portions of the first spacer layer 150 may be removed over substantially horizontal surfaces of the resist layer 140' and the anti-reflective layer 130, while the first spacer layer 150 may remain over substantially vertical surfaces of the resist layer 140'. As such, a top surface of the resist layer 140' and portions of the anti-reflective layer 130 may be exposed. This may be accomplished by anisotropically etching the first spacer layer 150, forming first spacers 150' adjoining the sidewalls of the resist layer 140'. The etchants may be selected depending upon the material used in the first spacer layer 150. For example, if the first spacer layer 150 is formed from a silicon oxide, a fluorocarbon chemistry may be utilized to conduct the etch. For the sake of example only, the first spacer layer 150 may be etched using tetrafluoromethane ($CF_4$), trifluoromethane ($CHF_3$), or other conventional etchant for selectively etching a silicon oxide. The first spacers 150' may have substantially the same vertical profile as the sidewalls of the resist layer 140'. The first spacers 150' may have a width about equal to x/3. The first spacers 150' may function as a mask for subsequent etching of the anti-reflective layer 130 and the intermediate layer 120.

Figure 5:
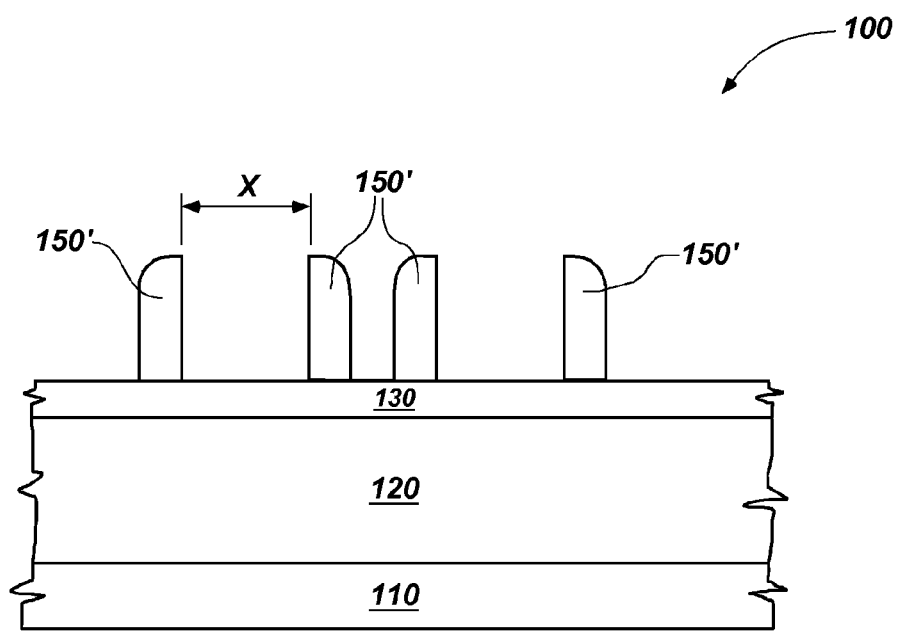
FIG. 5 illustrates an embodiment of the partially fabricated integrated circuit device of FIG. 4 after the features of FIG. 2 have been removed.

As illustrated in FIG. 5, the resist layer 140' may be selectively removed relative to the first spacers 150'. Stated another way, after etching, the first spacers 150' may remain on the surface of the anti-reflective layer 130. The resist layer 140' may be removed from between the first spacers 150', exposing underlying portions of the anti-reflective layer 130. Voids created by removing the resist layer 140' may have a width about equal to x. The resist layer 140' may be selectively etched using a dry etch process with an oxygen-based plasma. The removal of the resist layer 140' may be highly anisotropic to maintain the vertical profile of the first spacers 150'.

Figure 6:
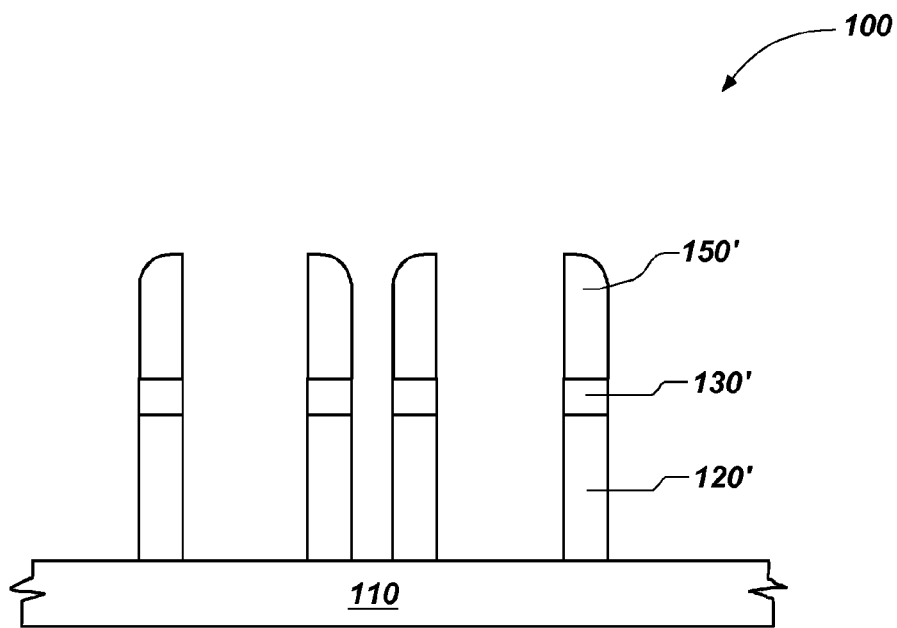
FIG. 6 illustrates an embodiment of the partially fabricated integrated circuit device of FIG. 5 after portions of the intermediate layer and the anti-reflective layer have been removed.

Next, as illustrated in FIG. 6, exposed portions of the anti-reflective layer 130 and portions of the intermediate layer 120 may be removed. The exposed portions of the anti-reflective layer 130, such as those previously beneath the resist layer 140', may be etched. The pattern in the anti-reflective layer 130 may then be transferred to the intermediate layer 120. The first spacers 150' may function as a mask, protecting underlying portions of the anti-reflective layer 130' and the intermediate layer 120'. The anti-reflective layer 130 and the intermediate layer 120 may be etched using a single etch chemistry or may be etched separately. Etching the anti-reflective layer 130 and the intermediate layer 120 may be accomplished by conventional techniques. For example, where anti-reflective layer 130 is formed from silicon oxynitride, a plasma etch including a fluorocarbon chemistry, such as $CF_4$ or difluoromethane ($CH_2F_2$), or an acid, such as hydrobromic acid (HBr), may be used, among others. When intermediate layer 120 is formed from transparent carbon, a plasma etch utilizing nitrogen ($N_2$), oxygen ($O_2$), and hydrobromic acid may be used. Other possible plasma chemistries include $O_2$ and sulfur dioxide ($SO_2$). The etch of the anti-reflective layer 130 may reduce the height of the first spacers 150'. However, the etch of the intermediate layer 120 may have substantially no effect on the height of the first spacers 150'.

Figure 7:
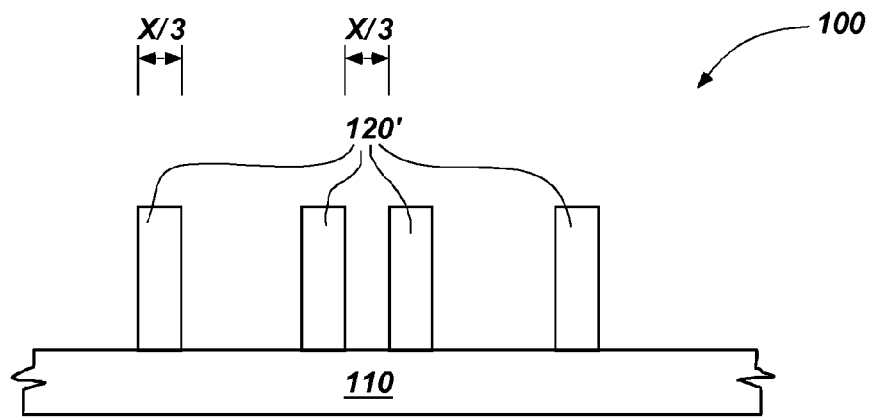
FIG. 7 illustrates an embodiment of the partially fabricated integrated circuit device of FIG. 6 after the first spacers and the anti-reflective layer have been removed.

As illustrated in FIG. 7, the first spacers 150' and the anti-reflective layer 130' may be removed, leaving vertical sections or vertical regions of intermediate layer 120' above target layer 110. The first spacers 150' and the anti-reflective layer 130' may be removed by conventional etchants. For example, the first spacers 150' and the anti-reflective layer

130' may be etched by a wet etch with buffered hydrofluoric acid. Alternatively, the first spacers 150' and the anti-reflective layer 130' may be removed by the etch chemistry used to etch the anti-reflective layer 130'.

Figure 8:
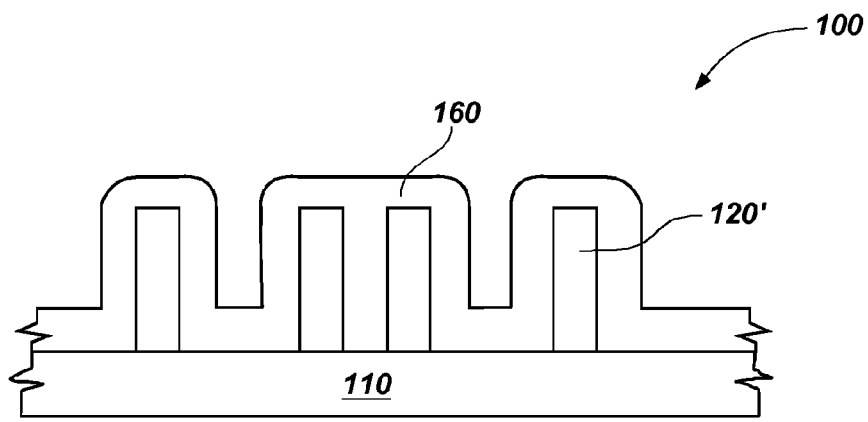
FIG. 8 illustrates an embodiment of a second spacer layer formed over the partially fabricated integrated circuit device of FIG. 7.

As illustrated in FIG. 8, a second spacer layer 160 may be formed on the intermediate layer 120'. The second spacer layer 160 may be formed from the same material as used in the first spacer layer 150. Thus, second spacer layer 160 may be formed using the same process equipment utilized in forming the first spacer layer 150. In this way, the amount of equipment and the attendant maintenance may be reduced. In addition, by using the same material, the costs of developing and depositing different materials are saved. The second spacer layer 160 may be conformally deposited over the intermediate layer 120' at a thickness equal to about x/3. By conformally depositing the material of the second spacer layer 160, gaps between neighboring portions of the intermediate layer 120' may be reduced from about x to about x/3.

Figure 9:
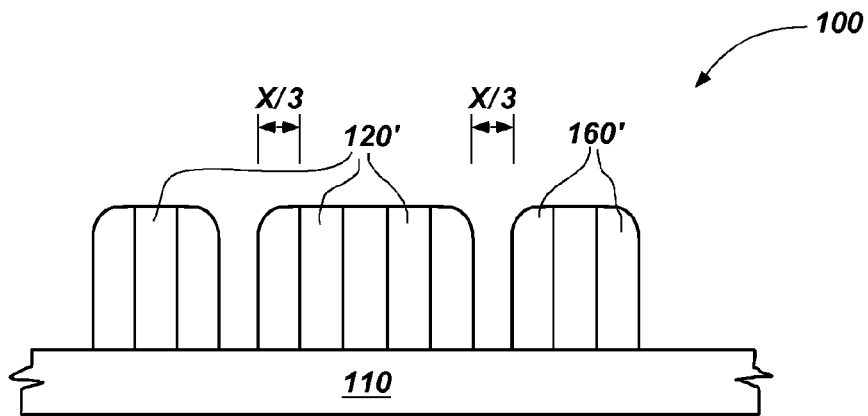
FIG. 9 illustrates an embodiment of the partially fabricated integrated circuit device of FIG. 8 after removing portions of the second spacer layer to form second spacers.

As illustrated in FIG. 9, portions of the second spacer layer 160 may be removed to form second spacers 160'. Substantially horizontal portions of the second spacer layer 160 may be removed by an anisotropic etch, while substantially vertical portions of the second spacer layer 160 may remain, forming the second spacers 160'. The anisotropic etch may expose a top surface of the intermediate layer 120'. The second spacers 160' may have a width equal to about x/3. The substantially horizontal portions of the second spacer layer 160 may be removed by conventional techniques, as discussed above with respect to removing portions of the first spacer layer 150.

Figure 10:
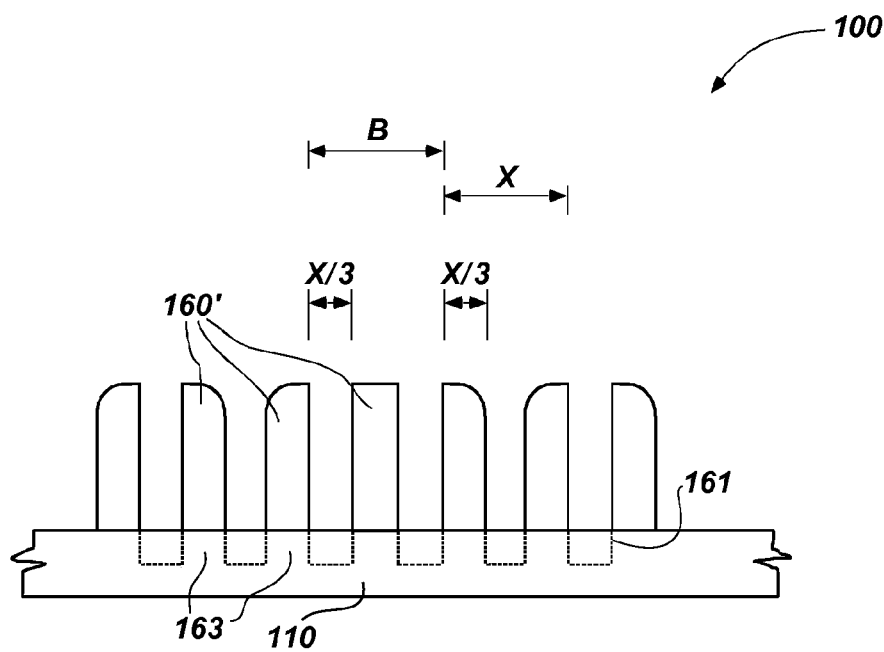
FIG. 10 illustrates an embodiment of the partially fabricated integrated circuit device of FIG. 9 after remaining portions of the intermediate layer have been removed.

As illustrated in FIG. 10, the intermediate layer 120' may be removed by selectively etching this layer relative to the second spacers 160' and the target layer 110. The intermediate layer 120' may be etched by conventional techniques, such as by utilizing the same etch chemistry used to etch the intermediate layer 120. Sidewalls of the second spacers 160' may have a substantially vertical profile. The second spacers 160' may have a width of about x/3 and may be separated from one another by a distance of about x/3. FIG. 10 also illustrates the initial width x of the resist layer 140' and the original space B between neighboring portions of the resist layer 140'. Thus, second spacers 160' having about one-third the width of the resist layer 140' may be formed on target layer 110. About equal spacing may be achieved between the adjacent second spacers 160'. By using the second spacers 160' as a sacrificial mask, the target layer 110 may be patterned as shown by broken line 161, forming features 163 having a CD about ⅓ of the CD of the resist layer 140'. Target layer 110 may be patterned by conventional techniques, which are not described in detail herein.

To further reduce the CD of the features formed on the target layer, additional spacer etch processes may be used. For instance, a third (or additional) spacers may be formed over the second spacers 160' after removing the intermediate layer 120'. The additional spacers may have a thickness about equal to the CD of the features to be formed on the target layer 110. The additional spacers may be deposited at a thickness that corresponds to a fraction of x.

The target layer 110 may be utilized in semiconductor devices, such as dynamic random access memories (DRAMs), static random access memories (SRAMs), ferroelectric memories (FEMs), NAND and NOR Flash memories, microprocessors, such as with field-effect transistors (FETs), and flat-panel displays. For example, the target layer 110 may be a wafer substrate to be etched for the formation of shallow trench isolation (STI) structures isolating cells of a NAND flash device. Target layer 110 may also be a conductive active layer, such as a polysilicon layer to be patterned into gates for transistors. Target layer 110 may also be a metal layer, such as aluminum, tungsten, titanium, or copper, to be patterned as conductive lines connecting different active areas. In addition to, or instead of, etching target layer 110, material may be deposited on target layer 110 filling in voids between the second spacers 160'.

Any of the above acts may be combined with other acts depending upon the materials used in the different layers and the processes used in forming and removing the materials. Additionally, any of the above acts may utilize multiple processes to accomplish the single act. After any act, further processing, not described above, may also occur. Examples of additional processing include ion implantation, diffusion doping, deposition of additional layers, wet or dry etching, and chemical-mechanical polishing. For the sake of example only, after any act, etching may be used to narrow, smooth, or improve the profile of an exposed layer.

By utilizing the above-described method, a 248 nm photoresist material, in combination with two or more spacer etch processes, may be used to form small features on the target layer 110. The features may have a CD that is a fraction of the CD conventionally achievable with the 248 nm photoresist. 248 nm photolithography may be used to pattern the resist layer 140 at a resolution within the limits of this technique. As this stage, the remaining portions of the resist layer 140' may have larger CDs than the CDs of the features to be formed in the target layer 110. By using the first and second spacers 150', 160' as sacrificial masks, the spacer etch processes may be conducted to form features having CDs one-third or one-fourth of the CDs of the portions of the resist layer 140'. As such, the CDs of the features may be smaller than those achievable using a more advanced photolithography technique, such as 193 nm photolithography.

The above-described embodiments may be utilized to produce a reduced CD, or pitch, of the features on the target layer 110 relative to the CD of etched portions of the resist layer 140'. For example, when resist layer 140', as illustrated in FIG. 2, is formed using a 248 nm photoresist, x may be about 120 nm and B may be about 120 nm, for a total pitch of about 240 nm. After patterning the resist layer 140 and conducting the spacer etch processes, the width of second spacers 160', as illustrated in FIG. 10, may be about 40 nm and the distance between neighboring second spacers 160' may also equal about 40 nm, for a total pitch of about 80 nm. However, the width of the resist layer 140' may be any width within a range of from about 30 nm to about 150 nm. Thus, features having a width of from about 10 nm to about 50 nm may be formed in the target layer 110.

By adjusting the width of the resist layer 140', the spacing between adjacent portions of the resist layer 140', and the thickness of the deposited spacer layers, additional reductions in CD or pitch may be achieved. Embodiments of the invention also encompass a method of reducing the CD or minimum pitch of a feature by a factor of 4. An embodiment of a quadruple pitch reduction method according to the present invention is illustrated in FIGS. 11-19. Substantially similar materials and processing acts are used in this embodiment relative to the previous embodiment. The embodiment illustrated in FIGS. 11-19 differs from the embodiment illustrated in FIGS. 1-10, inter alia, in that the width of the resist layer 140' is different, as is the spacing between adjacent portions of the resist layer 140'. In addition, the thicknesses of the deposited spacer layers differ.

Figure 11:
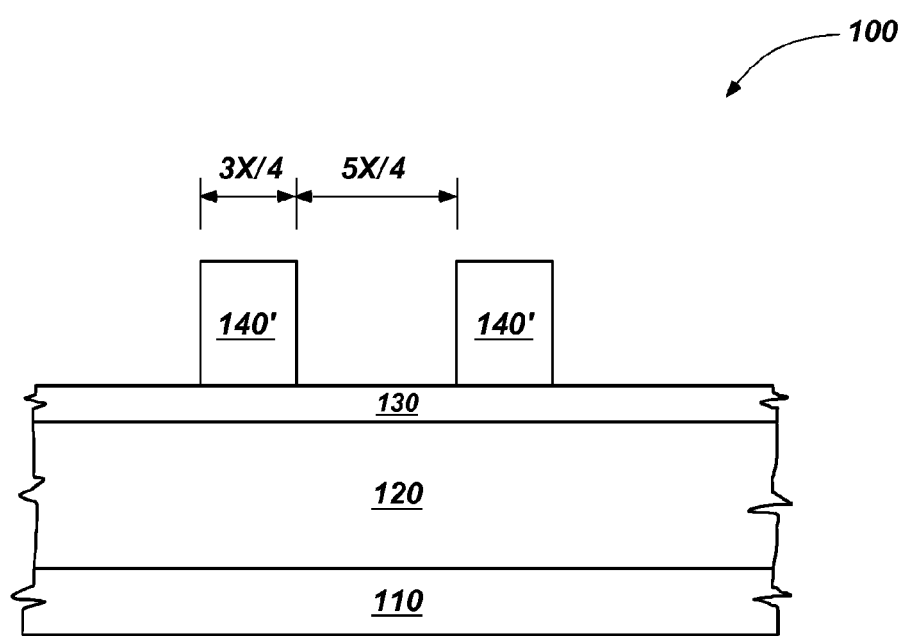
FIG. 11 illustrates an embodiment of the features of FIG. 2 after the features have been trimmed.

FIG. 11 illustrates substantially the same partially fabricated integrated circuit device 100 illustrated in FIG. 2, except that the remaining portions of the resist layer 140' have a width of about 3x/4 and the spacing between adjacent portions of the resist layer 140' is about 5x/4. The resist layer 140 may be deposited and patterned as known in the art, to produce this spacing. For the sake of example only, the resist layer 140 may be patterned such that portions of the resist layer 140' have a width of about x and the spacing between adjacent portions of the resist layer 140' is about x. The portions of the resist layer 140' may be further etched or trimmed to have a width of about 3x/4, which increases the spacing between adjacent portions of the resist layer 140' to about 5x/4.

Figure 12:
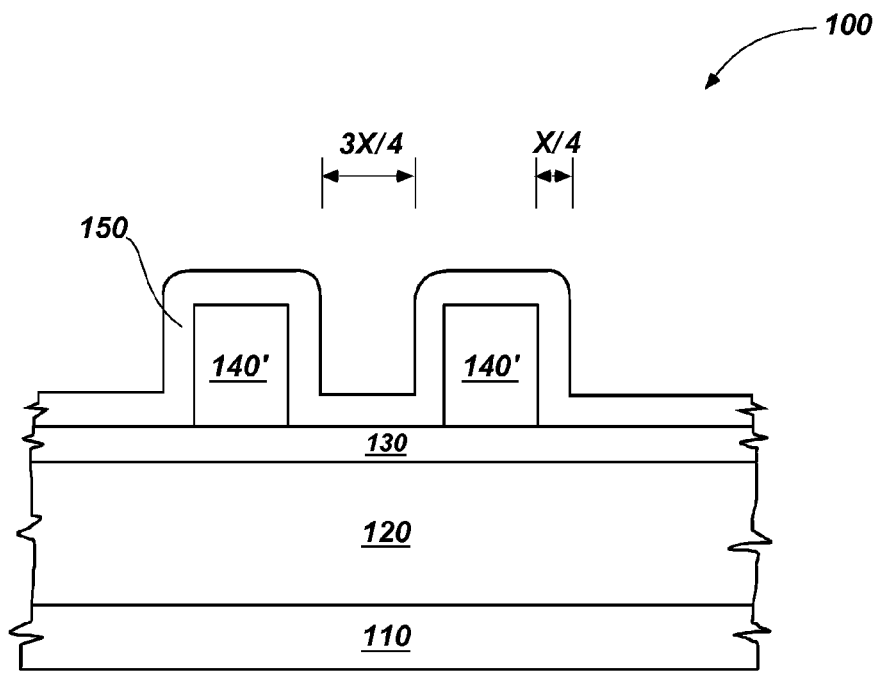
FIG. 12 illustrates an embodiment of a first spacer layer formed over the features of FIG. 11.

FIG. 12 illustrates that the first spacer layer 150 may be formed over the resist layer 140' and the anti-reflective layer 130. The first spacer layer 150 may be conformally deposited at a thickness of about x/4. As previously described, the thickness of the first spacer layer 150 may correspond to the CD of the features to be formed on the target layer 110. The first spacer layer 150 may be deposited by ALD.

Figure 13:
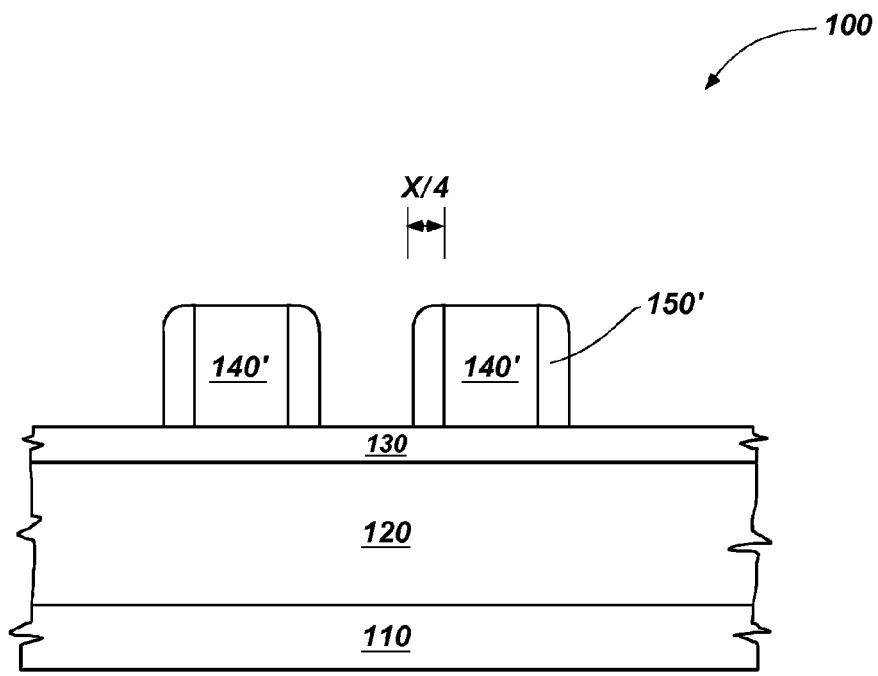
FIG. 13 illustrates an embodiment of first spacers fondled from the first spacer layer of FIG. 12.
Figure 14:
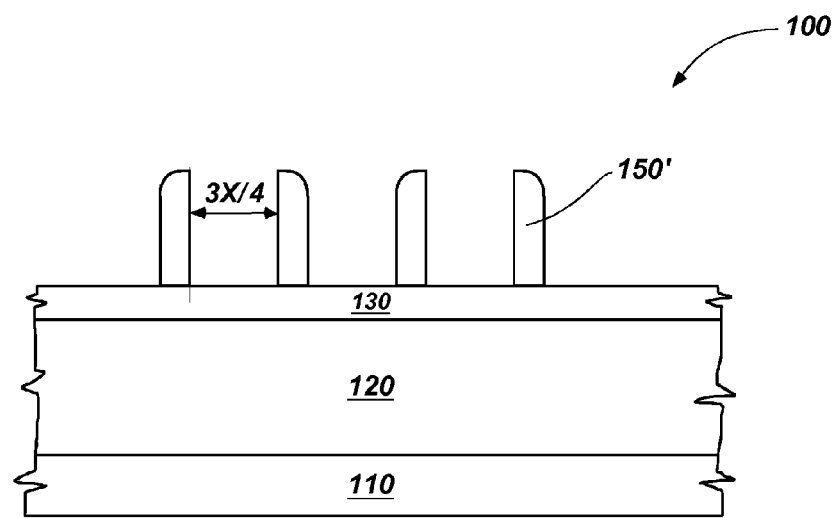
FIG. 14 illustrates an embodiment of the partially fabricated integrated circuit device of FIG. 13 after the features of FIG. 11 have been removed.
Figure 15:
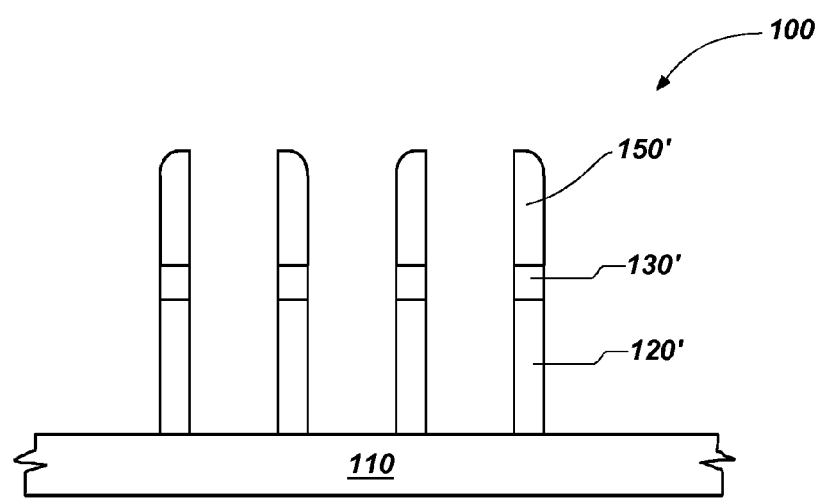
FIG. 15 illustrates an embodiment of the partially fabricated integrated circuit device of FIG. 14 after portions of the intermediate layer and the anti-reflective layer have been removed.
Figure 16:
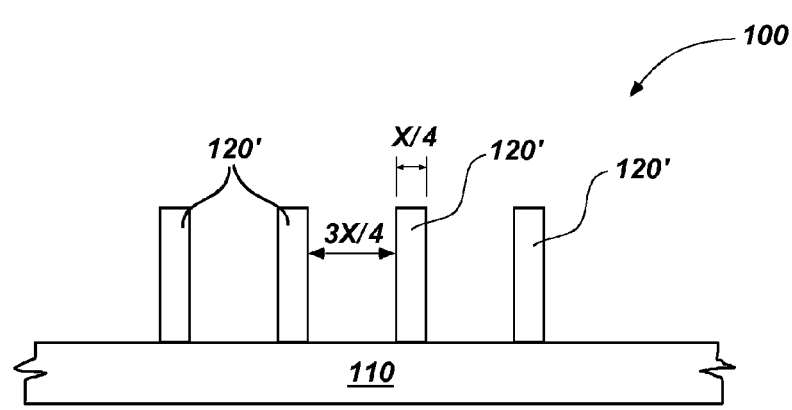
FIG. 16 illustrates an embodiment of the partially fabricated integrated circuit device of FIG. 15 after the first spacers and the anti-reflective layer have been removed.

FIG. 13 illustrates the removal of the first spacer layer 150 from substantially horizontal surfaces of the resist layer 140' and the anti-reflective layer 130, such as by an anisotropic etch. The first spacer material 150 may remain on substantially vertical surfaces of the resist layer 140', forming the first spacers 150'. The first spacers 150' may have a thickness equal to about x/4 and the spacing between adjacent portions of the resist layer 140' may be reduced to about 3x/4. FIG. 14 illustrates that the resist layer 140' may be removed, leaving the first spacers 150' on top of anti-reflective layer 130. The spacing between adjacent first spacers 150' may be about 3x/4. FIG. 15 illustrates that portions of anti-reflective layer 130 and intermediate layer 120 may be removed using the first spacers 150' as a mask. As such, the portions of the anti-reflective layer 130' and the intermediate layer 120' beneath the first spacers 150' may be protected during this etch. FIG. 16 illustrates that the first spacers 150' and the anti-reflective layer 130' may be removed, leaving the intermediate layer 120' on the surface of target layer 110. The intermediate layer 120' may have a width of about x/4 and the distance between adjacent portions of the intermediate layer 120' may be about 3x/4.

Figure 17:
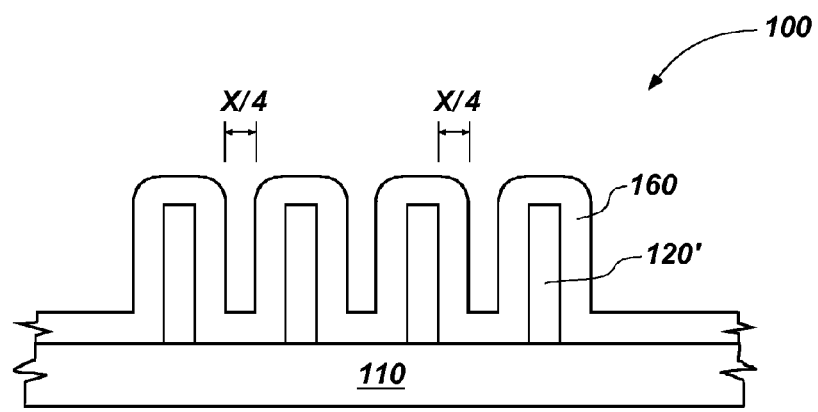
FIG. 17 illustrates an embodiment of a second spacer layer formed on the partially fabricated integrated circuit device of FIG. 16.

FIG. 17 illustrates that the second spacer layer 160 may be formed on portions of the intermediate layer 120'. The second spacer layer 160 may be conformally deposited, such as by ALD, at a thickness of about x/4.

Figure 18:
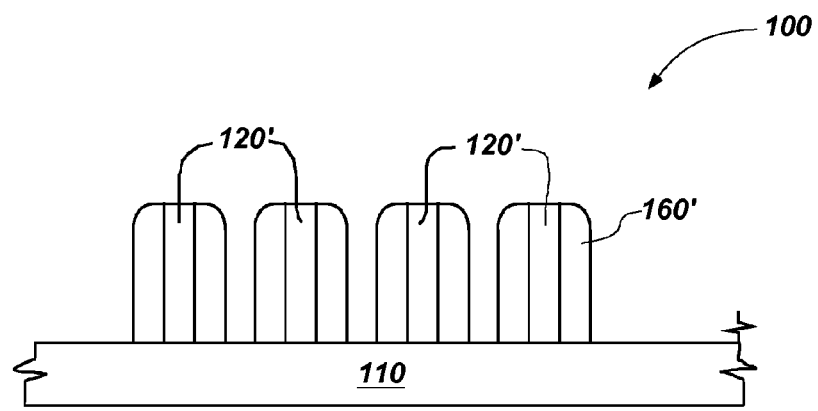
FIG. 18 illustrates an embodiment of the partially fabricated integrated circuit device of FIG. 17 after removing portions of the second spacer layer to form second spacers.
Figure 19:
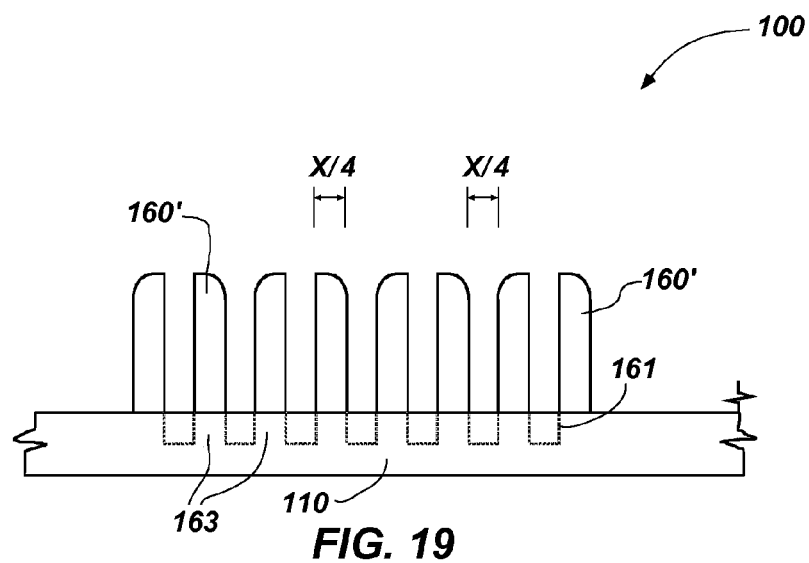
FIG. 19 illustrates an embodiment of the partially fabricated integrated circuit device of FIG. 18 after the remaining portions of the intermediate layer have been removed.

FIG. 18 illustrates that substantially horizontal portions of the second spacer layer 160 may be removed, exposing the top surfaces of the intermediate layer 120' and portions of the target layer 110. The remaining portions of the second spacer layer 160 may form the second spacers 160'. The intermediate layer 120' may be removed, as illustrated in FIG. 19. The second spacers 160' may have a width of about x/4 and may be separated from adjacent second spacers 160' by a distance of about x/4. The spacing between the adjacent second spacers 160' may enable features having one-fourth the CD of the resist layer 140' to be formed on the target layer 110. Using the second spacers 160' as a mask, the target layer 110 may be patterned as shown by broken line 161, forming features 163 having the desired quadruple reduction in pitch.

Using this embodiment of the quadruple reduction, when the resist layer 140' as illustrated in FIG. 11 has a width of about 90 nm (3x/4=90 nm) and a width B of about 150 nm (5x/4=150 nm), such as formed with a 248 nm photoresist, the resulting width of the second spacers 160' may be about 30 nm and the distance between adjacent second spacers 160' may also be equal to about 30 nm. Thus, using embodiments of the quadruple reduction, features having a CD about one-fourth of the CD of the resist layer 140' may be formed.

Thus, embodiments of the present invention may be utilized to produce features in a target layer 110 having a CD about one-third or one-fourth the CD of the width of the resist layer 140'. As such, features having a CD less than about 50 nm may be formed in the target layer 110. There is no lower limit on the final CD, and the final pitch, of the features 163 (FIG. 10) formed using embodiments of the invention. For example, since the thickness of the first and second spacer layers 150, 160 may be precisely controlled by ALD, the CDs of the features 163 formed in the target layer 110 may be precisely controlled.

Although this invention has been described with reference to particular embodiments, the invention is not limited to these described embodiments. Rather, the invention is limited only by the appended claims, which include within their scope all equivalent methods, processes, devices, and systems that operate according to the principles of the invention as described.

What is claimed is:

1. A method of forming an integrated circuit structure, comprising:
    forming openings in a resist material located above an intermediate material on a target material;
    forming a first set of spacers on sidewalls of remaining portions of the resist material;
    removing the remaining portions of the resist material and material underlying the remaining portions of the resist material to expose portions of the target material except for portions masked by the first set of spacers;
    removing the first set of spacers;
    exposing vertical sections of the intermediate material; and
    forming a second set of spacers on sidewalls of the vertical sections of the intermediate material, the second set of spacers comprised of the same material as the first set of spacers such that a first portion of the second set of spacers is separated from first neighboring spacers by a distance equal to a width of one of the second set of spacers, a second portion of the second set of spacers is separated from a second neighboring spacer by voids and the substantially vertical sections of the intermediate material, and a third portion of the second set of spacers is separated from third neighboring spacers by remaining portions of the substantially vertical sections of the intermediate material on both sides of the third portion of the second set of spacers.

2. The method of claim 1, wherein the forming the openings in the resist material located above the intermediate material comprises forming the openings having a critical dimension of x and remaining portions of the resist material having a critical dimension of x.

3. The method of claim 2, further comprising forming features in the exposed portions of the target material, the features having a critical dimension of x/3.

4. The method of claim 1, wherein the forming openings in the resist material located above the intermediate material comprises forming openings having a critical dimension of 5x/4 and the remaining portions of the resist material having a critical dimension of 3x/4.

5. The method of claim 4, further comprising forming features in the exposed portions of the target material, the features having a critical dimension of x/4.

6. The method of claim 1, wherein the forming the first set of spacers on the sidewalls of the remaining portions of the resist material comprises depositing a spacer material at a thickness about equal to a critical dimension of features to be formed on the target material.

7. An integrated circuit structure, comprising:
a target material;
substantially vertical sections of an intermediate material located and formed on the target material; and
spacers formed on the target material, the spacers having a width of either one-third or one-fourth of a minimum feature size, the spacers separated from neighboring spacers by a distance equal to the width of one of the spacers, a portion of the spacers being separated from the neighboring spacers by a void and the substantially vertical sections of the intermediate material, remaining spacers being separated from the neighboring spacers only by the substantially vertical sections of the intermediate material.

8. The integrated circuit structure of claim 7, wherein the intermediate material comprises a first material and the spacers comprise a second material, the first material being selectively etchable relative to the second material.

9. The integrated circuit structure of claim 7, wherein the spacers comprise silicon oxide or silicon nitride.

10. The integrated circuit structure of claim 7, wherein the substantially vertical sections of the intermediate material have a width equal to the width of one of the spacers.

11. The integrated circuit structure of claim 7, wherein the substantially vertical sections of the intermediate material are separated by a distance of about three-fourths of the minimum feature size.

12. An integrated circuit structure, comprising:
a target material having substantially vertical sections of an intermediate material thereon; and
spacers on sidewalls of the substantially vertical sections of the intermediate material such that a first portion of the spacers is separated from first neighboring spacers by a distance equal to a width of one of the spacers, a second portion of the spacers is separated from a second neighboring spacer by voids and the substantially vertical sections of the intermediate material, and a third portion of the spacers is separated from third neighboring spacers by remaining portions of the substantially vertical sections of the intermediate material on both sides of the third portion of the spacers.

13. The integrated circuit structure of claim 12, wherein the intermediate material is selected from the group consisting of transparent carbon, amorphous carbon and a spin-on material.

14. The integrated circuit structure of claim 12, wherein the spacers comprise silicon oxide or silicon nitride.

15. The integrated circuit structure of claim 12, wherein the substantially vertical sections of the intermediate material are separated by a distance of about one-third of a minimum feature size.

16. The integrated circuit structure of claim 12, wherein the substantially vertical sections of the intermediate material are separated by a distance of about three-fourths of a minimum feature size.

17. The integrated circuit structure of claim 12, wherein the intermediate material comprises a material that is selectively etchable relative to the spacers.

18. The integrated circuit structure of claim 12, wherein the spacers have a thickness of about one-third of a minimum feature size.

19. The integrated circuit structure of claim 12, wherein a top surface of the substantially vertical sections of the intermediate material is exposed.

20. The method of claim 1, further comprising removing the vertical sections of the intermediate material.

21. The method of claim 20, further comprising forming features in the exposed portions of the target material, the features having a critical dimension about equal to a thickness of one spacer of the first set of spacers.

* * * * *

UNITED STATES PATENT AND TRADEMARK OFFICE
CERTIFICATE OF CORRECTION

| | | |
|---|---|---|
| PATENT NO. | : 8,836,083 B2 | Page 1 of 1 |
| APPLICATION NO. | : 13/619905 | |
| DATED | : September 16, 2014 | |
| INVENTOR(S) | : Baosuo Zhou | |

It is certified that error appears in the above-identified patent and that said Letters Patent is hereby corrected as shown below:

In the Claims,

In column 10, line 50, in Claim 2, before "remaining" insert -- the --.

Signed and Sealed this
Eighteenth Day of November, 2014

Michelle K. Lee
*Deputy Director of the United States Patent and Trademark Office*